(12) United States Patent
Kelkar et al.

(10) Patent No.: US 10,032,749 B2
(45) Date of Patent: Jul. 24, 2018

(54) THREE-DIMENSIONAL CHIP-TO-WAFER INTEGRATION

(71) Applicant: Maxim Integrated Products, Inc., San Jose, CA (US)

(72) Inventors: Amit S. Kelkar, Flower Mound, TX (US); Karthik Thambidurai, Plano, TX (US); Viren Khandekar, Flower Mound, TX (US); Hien D. Nguyen, The Colony, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/942,708

(22) Filed: Nov. 16, 2015

(65) Prior Publication Data

US 2016/0071826 A1    Mar. 10, 2016

Related U.S. Application Data

(62) Division of application No. 13/281,534, filed on Oct. 26, 2011, now Pat. No. 9,190,391.

(51) Int. Cl.
*H01L 21/00* (2006.01)
*H01L 23/48* (2006.01)
(Continued)

(52) U.S. Cl.
CPC ...... *H01L 25/0657* (2013.01); *H01L 23/5389* (2013.01); *H01L 24/19* (2013.01);
(Continued)

(58) Field of Classification Search
CPC . H01L 2224/73265; H01L 2224/48227; H01L 2224/97; H01L 2924/181; H01L 2924/15311; H01L 2224/48247; H01L 2224/32145; H01L 25/0657; H01L 2924/00; H01L 2924/00014;
(Continued)

(56) References Cited

U.S. PATENT DOCUMENTS 6,714,418 B2    3/2004    Frankowsky et al.
7,332,820 B2 *  2/2008    Tan .................... H01L 23/3128
                                                              257/777
(Continued)

FOREIGN PATENT DOCUMENTS

CN    101197356 A    6/2008
CN    101996895 A    3/2011
CN    102034718 A    4/2011

OTHER PUBLICATIONS

Office Action dated May 27, 2016 for Chinese Appln. No. 2012104174253.
(Continued)

*Primary Examiner* — Joseph C Nicely
*Assistant Examiner* — David Goodwin
(74) *Attorney, Agent, or Firm* — Advent, LLP; Kevin E. West (57) ABSTRACT

An integrated circuit device is disclosed that includes a semiconductor substrate and a die attached to the semiconductor substrate. A conductive pillar is connected to at least one of the semiconductor substrate or the die. An overmold is molded onto the semiconductor substrate over the die, and the conductive pillar extends through the overmold.

11 Claims, 4 Drawing Sheets

(51) Int. Cl.
*H01L 25/065* (2006.01)
*H01L 23/00* (2006.01)
*H01L 23/538* (2006.01)
*H01L 25/00* (2006.01)
*H01L 23/31* (2006.01)
*H01L 21/56* (2006.01)

(52) U.S. Cl.
CPC .............. *H01L 24/24* (2013.01); *H01L 24/73* (2013.01); *H01L 25/50* (2013.01); *H01L 21/561* (2013.01); *H01L 23/3121* (2013.01); *H01L 24/16* (2013.01); *H01L 24/25* (2013.01); *H01L 2224/0239* (2013.01); *H01L 2224/02371* (2013.01); *H01L 2224/0401* (2013.01); *H01L 2224/05548* (2013.01); *H01L 2224/12105* (2013.01); *H01L 2224/131* (2013.01); *H01L 2224/13024* (2013.01); *H01L 2224/16145* (2013.01); *H01L 2224/16225* (2013.01); *H01L 2224/16227* (2013.01); *H01L 2224/24146* (2013.01); *H01L 2224/24226* (2013.01); *H01L 2224/25171* (2013.01); *H01L 2224/32145* (2013.01); *H01L 2224/73209* (2013.01); *H01L 2224/73253* (2013.01); *H01L 2224/73267* (2013.01); *H01L 2224/94* (2013.01); *H01L 2224/96* (2013.01); *H01L 2224/97* (2013.01); *H01L 2225/06513* (2013.01); *H01L 2225/06524* (2013.01); *H01L 2225/06548* (2013.01); *H01L 2225/06558* (2013.01); *H01L 2225/06586* (2013.01); *H01L 2225/06589* (2013.01); *H01L 2924/01029* (2013.01); *H01L 2924/10253* (2013.01); *H01L 2924/1461* (2013.01); *H01L 2924/181* (2013.01)

(58) Field of Classification Search
CPC . H01L 2924/00012; H01L 2224/32225; H01L 2224/48091; H01L 2224/01
See application file for complete search history.

(56) References Cited

U.S. PATENT DOCUMENTS

| | | | | |
|---|---|---|---|---|
| 7,812,447 | B2* | 10/2010 | Boon | H01L 21/561 257/680 |
| 8,039,304 | B2* | 10/2011 | Pagaila | H01L 21/561 257/E21.705 |
| 8,110,440 | B2* | 2/2012 | Bathan | H01L 21/768 257/686 |
| 8,143,097 | B2* | 3/2012 | Chi | H01L 21/6835 257/777 |
| 8,354,297 | B2* | 1/2013 | Pagaila | H01L 25/16 257/678 |
| 8,368,232 | B2* | 2/2013 | Bchir | H01L 24/81 257/704 |
| 8,736,075 | B2* | 5/2014 | Choi | H01L 25/16 257/686 |
| 9,190,391 | B2* | 11/2015 | Kelkar | H01L 24/19 |
| 2006/0261475 | A1 | 11/2006 | Boon | |
| 2008/0136004 | A1* | 6/2008 | Yang | H01L 24/96 257/686 |
| 2011/0068459 | A1* | 3/2011 | Pagaila | H01L 21/568 257/698 |
| 2012/0112355 | A1* | 5/2012 | Pagaila | H01L 21/561 257/773 |
| 2012/0217629 | A1* | 8/2012 | Cho | H01L 25/16 257/692 |

OTHER PUBLICATIONS

Gaurav Sharma, Vempati Srinivas Rao, Aditya Kumar, Nandar Su, Lim Ying Ying, Khong Chee Houe, Sharon Lim, Vasarla Nagendra Sekhar, Ranjan Rajoo, Viadyanathan Kripesh & John H. Lau; Embedded Wafer Level Packages with Laterally Placed and Vertically Stacked Thin Dies; Electronic Components and Technology Conference; 2009; pp. 1537-1543.

* cited by examiner

THREE-DIMENSIONAL CHIP-TO-WAFER INTEGRATION

BACKGROUND

A Three-Dimensional Integrated Circuit (3D IC) can be constructed using two or more layers of electronic components integrated into a single IC chip. The electronic components may be stacked to form a single electrical circuit. In some instances, vertical Through-Silicon Via (TSV) connections are used to connect to the electronic components of the 3D IC. However, when two or more dies are stacked on top of one another, the use of TSV connections may require redesigning each die that is stacked below another die in order to connect to the lower die with a TSV. In other instances, through-mold solder connections, such as Through-Mold Via (TMV) connections, use solder balls to furnish interconnection between a Printed Circuit Board (PCB) and the top side of a molding compound. However, this type of configuration limits the minimum possible spacing between connections to the PCB as determined by the sizes and spacing requirements of the solder balls.

SUMMARY

An integrated circuit device is disclosed that includes a semiconductor substrate and a die attached to the semiconductor substrate. An overmold is molded onto the semiconductor substrate over the die. A conductive pillar is connected to at least one of the semiconductor substrate or the die and extends through the overmold. In embodiments, the semiconductor substrate may comprise a second die. The conductive pillar may be formed on the die and/or the second die. The overmold may be used to mold the first die onto the second die, so that the conductive pillar extends through the overmold. In other embodiments, the semiconductor substrate may comprise a carrier. The overmold may be used to mold the die onto the carrier, so that the conductive pillar extends through the overmold.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

DETAILED DESCRIPTION

Overview

A 3D IC can be constructed using two or more layers of electronic components integrated into a single IC chip. The electronic components may be stacked to form a single electrical circuit. In some instances, vertical TSVs are used to connect to the electronic components of the 3D IC. However, when two or more dies are stacked on top of one another, this may require redesigning each die that is stacked below another die, in order to connect to the lower die with a TSV. In other instances, through mold solder connections, such as TMVs, use solder balls to interconnect between a PCB and the top side of a molding compound. However, this type of configuration limits the minimum possible spacing between connections to the PCB as determined by the sizes and spacing requirements of the solder balls.

Other types of 3D IC's can be constructed using an molded epoxy wafer onto which two or more dies can be placed. However, because a semiconductor die, such as a silicon die, has a different Coefficient of Thermal Expansion (CTE) than the epoxy material of the wafer, the thickness of the molding compound used to overmold the die to the wafer may need to be substantial to prevent warping of the resulting IC chip. Further, when reconstituting a molded wafer, the final package footprint/form factor for this type of configuration will always be larger than the largest die.

Accordingly, a three-dimensional (3D) semiconductor chip package is described that uses pillars formed of conductive material to connect to a die embedded in an overmold. In embodiments, the conductive pillars allow connections to the die to be arranged differently than the arrangement of the die (e.g., fanned out) without requiring re-design/re-layout of the die, and may also allow for a fine pitch between connections to the die. Further, the die can be attached to a live silicon wafer, such that the resulting footprint/form factor of the chip package is the same as that of the underlying die when singulated from the wafer. The semiconductor chip package can be formed by securing a silicon die to a silicon substrate, such as a silicon wafer, using an overmold. By forming the die and the substrate from the same type of substrate material, warping of the semiconductor chip package may be reduced during fabrication. The conductive pillars extending through the overmold can be connected to the dies and/or the substrate. Connections to the dies and/or the substrate can also be provided using TSV connections and/or TMV connections.

In some instances, the substrate may include electrical circuitry connected to one or more of the dies. In other instances, the substrate may be a sacrificial (dummy) carrier, such as a silicon carrier wafer (e.g., for implementing a fan-out type configuration). In some configurations, the die may be attached to the substrate in a face-up orientation. In other configurations, the die may be attached to the substrate in a face-down orientation. The conductive pillars may furnish electrical connection to the die and/or the substrate (e.g., for transferring electrical signals to and/or from the die or the substrate). The conductive pillars may also be used for thermal management of the semiconductor chip package. For instance, the conductive pillars may be thermally connected to a heat sink, a thermal pad, and so forth for transferring heat from the dies and/or the wafer. The 3D chip package can be used for devices that may require 3D heterogeneous die integration, such as power System on a Chip (SoC) devices, handheld devices, mobile phone devices, and/or portable electronic devices.

A 3D semiconductor chip package including one or more dies connected with conductive pillars may be formed in a Wafer Level Packaging (WLP) process by placing one or more dies on a semiconductor substrate, forming conductive pillars on the one or more dies and/or the semiconductor substrate, and molding the one or more dies onto the semiconductor substrate using an overmold. The surface of the overmold may be planarized (e.g., depending upon the molding process). The semiconductor substrate may comprise a sacrificial carrier, which may be thinned via back grinding and so forth to reduce the thickness of the chip package. For example, in embodiments, a first die may be placed on a second die. A conductive pillar may be formed on the first die and/or the second die. An overmold may be used to mold the first die onto the second die, so that the conductive pillar extends through the overmold. In other embodiments, a die may be placed on a carrier. A conductive pillar may be formed on the die. An overmold may be used to mold the die onto the carrier, so that the conductive pillar extends through the overmold.

As used herein, the term "semiconductor substrate" refers to substrates constructed of materials such as, but not limited to: silicon, silicon dioxide, aluminum oxide, sapphire, germanium, gallium arsenide (GaAs), alloys of silicon and germanium, and/or indium phosphide (InP). Further, for the purposes of the present disclosure, a semiconductor substrate can be formed as a semiconductor or an electrical insulator, and may include layers of both semiconducting and insulating material. For example, in implementations, a semiconductor substrate can be formed using an insulator, such as silicon oxide, with a layer of semiconducting material, such as silicon formed thereupon. Electrical components, such as transistors and diodes, can be fabricated in the semiconductor. In other implementations, the semiconductor substrate can be formed as an insulator, a dielectric, and so forth.

EXAMPLE IMPLEMENTATIONS

FIGS. 1 through 6 illustrate 3D semiconductor chip packages including one or more dies connected with conductive pillars in accordance with example implementations of the present disclosure. As shown, a semiconductor chip package can be formed using chip-to-wafer (C2W) stacking by molding a small silicon die onto a larger silicon substrate using an overmold. Referring now to FIGS. 1A through 6, a semiconductor device comprising a chip package 100 is described. The chip package 100 includes one or more dies 102 molded onto a semiconductor substrate, such as a wafer 104, using an overmold, such as a mold compound 106. Examples of a die 102 include, but are not necessarily limited to: a semiconductor die (e.g., a silicon die), a MicroElectroMechanical Systems (MEMS) die, and a passive die (e.g., a passive glass die). Connections are provided to the dies 102 and/or the wafer 104 using pillars 108 formed of conductive material (e.g., copper, gold, and so forth), which extend through the mold compound 106. For example, the pillars 108 can be electrically and/or thermally connected to integrated circuits provided with the dies 102 and/or the wafer 104. In some implementations, the pillars 108 can be connected to the die 102 to provide effective thermal management of a 3D package. Connections to the dies 102 and/or the wafer 104 can also be provided using TSV connections and/or TMV connections.

Figure 1A:
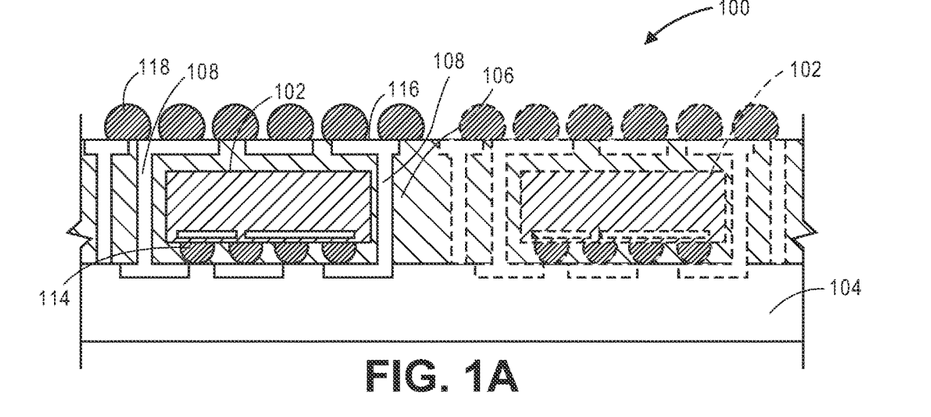
FIG. 1A is a diagrammatic partial cross-sectional side elevation view illustrating an integrated circuit device including a die embedded in an overmold molded onto a semiconductor wafer over the die, where the die is arranged in a face-down orientation in accordance with an example implementation of the present disclosure.
Figure 1B:
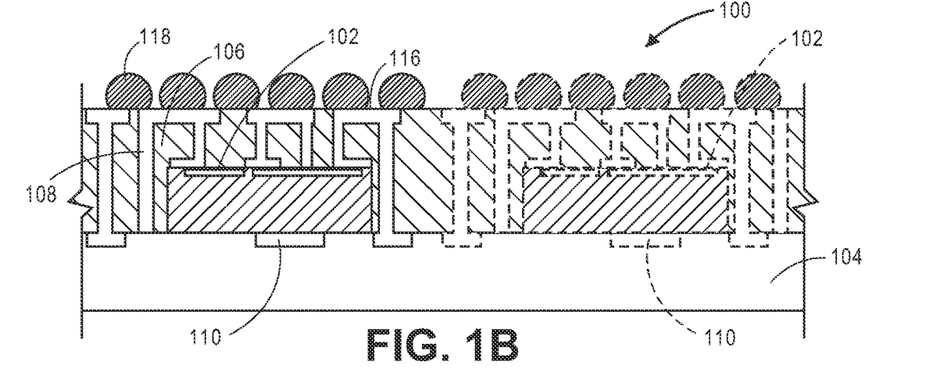
FIG. 1B is a diagrammatic partial cross-sectional side elevation view illustrating an integrated circuit device including a die embedded in an overmold molded onto a semiconductor wafer over the die, where the die is arranged in a face-up orientation in accordance with an example implementation of the present disclosure.
Figure 1C:
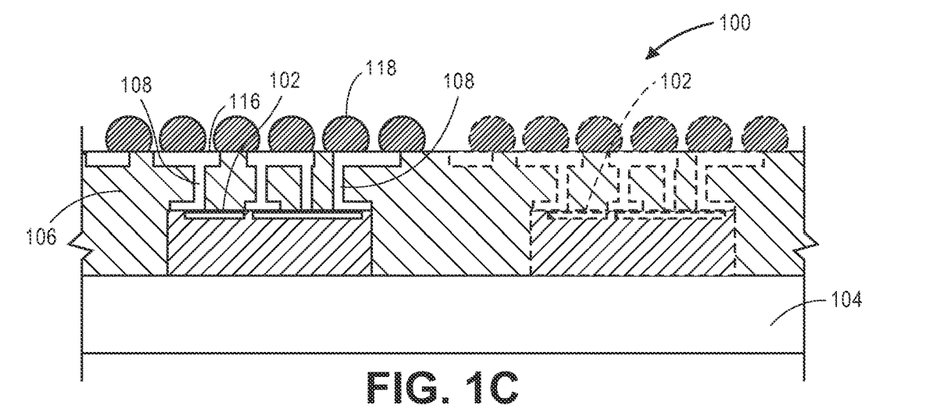
FIG. 1C is a diagrammatic partial cross-sectional side elevation view illustrating an integrated circuit device including a die embedded in an overmold molded onto a sacrificial wafer over the die, where the die is arranged in a face-up orientation in accordance with an example implementation of the present disclosure.

In embodiments, one or more of the dies 102 and the wafer 104 may be formed from the same type of substrate material to reduce warping. For example, the dies 102 and the wafer 104 may be formed using a silicon substrate. In embodiments, each die 102 can be about one hundred micrometers (100 μm) thick, while the mold compound 106 can be about three hundred micrometers (300 μm) thick, and the wafer 104 can be about seven hundred micrometers (700 μm) thick. It should be noted that these thicknesses are provided by way of example only and are not meant to be restrictive of the present disclosure. Thus, the chip package 100 may include dies 102, wafers 104, and/or mold compounds 106 having other various thicknesses. In some instances (e.g., as illustrated in FIGS. 1A and 1B), the wafer 104 may include electrical circuitry, such as transistors and so forth, which may be connected to one or more of the dies 102. For example, the wafer 104 may be singulated into individual semiconductor dies. In other instances (e.g., as illustrated in FIG. 1C), the wafer 104 may be a sacrificial (dummy) carrier, such as a silicon carrier wafer, where some or all of the carrier wafer can be removed after the dies 102 have been molded to the wafer 104.

In some embodiments, (e.g., as illustrated in FIG. 1A), the die 102 can be attached to the wafer 104 such that the top die is in a face-down orientation (i.e., connections to the top die are facing "down," i.e., toward the wafer 104). In other embodiments (e.g., as illustrated in FIGS. 1B and 1C), the die 102 can be attached to the wafer 104 such that the top die is in a face-up orientation (i.e., connections to the top die are facing "up," i.e., away from the wafer 104). In this type of face-up implementation, the die 102 can be connected to the wafer 104 using a die attach pad 110 (e.g., as illustrated in FIG. 1B). Further, in a face-up implementation, the connections to the die 102 can be arranged or rearranged to fan-out (e.g., to provide more spacing between the connections, as illustrated in FIG. 1C). This may be particularly useful as dies become smaller through increased miniaturization. For example, a die having a footprint of three millimeters by three millimeters (3 mm×3 mm) but requiring a five tenths millimeter (0.5 mm) pitch between connections may require a fan-out to achieve the desired pitch when multiple connection pads are present on the die.

Figure 2:
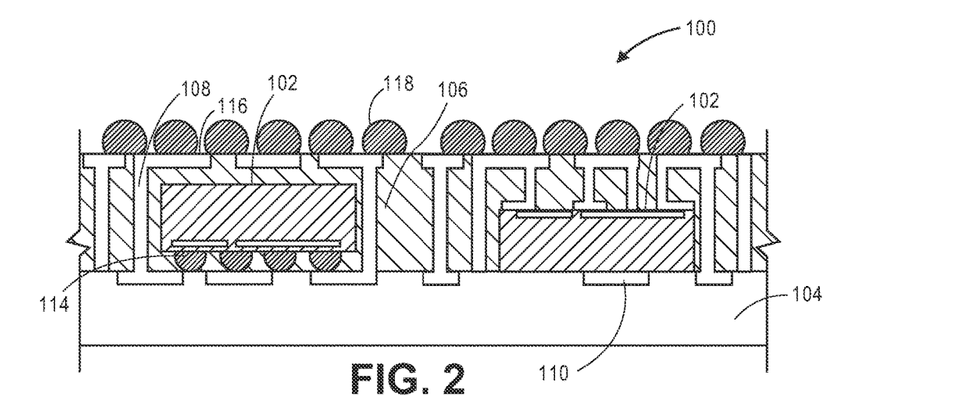
FIG. 2 is a diagrammatic partial cross-sectional side elevation view illustrating an integrated circuit device including a first die embedded in an overmold molded onto a semiconductor wafer over the first die, where the first die is arranged in a face-down orientation, and further including a second die embedded in the overmold molded onto the semiconductor wafer, where the second die is arranged in a face-up orientation in accordance with an example implementation of the present disclosure.
Figure 3:
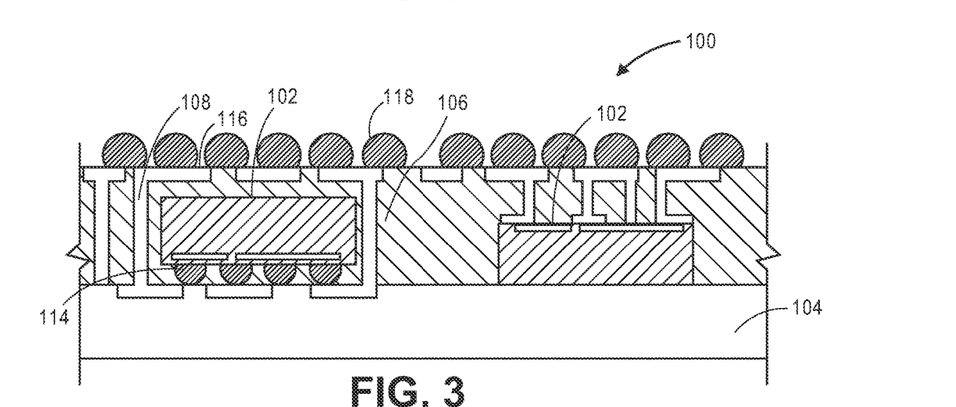
FIG. 3 is a diagrammatic cross-sectional side elevation view illustrating an integrated circuit device including a first die embedded in an overmold molded onto a semiconductor wafer over the first die, where the first die is arranged in a face-down orientation, and further including a second die embedded in the overmold molded onto the semiconductor wafer, where the second die is arranged in a face-up orientation in accordance with an example implementation of the present disclosure.
Figure 4:
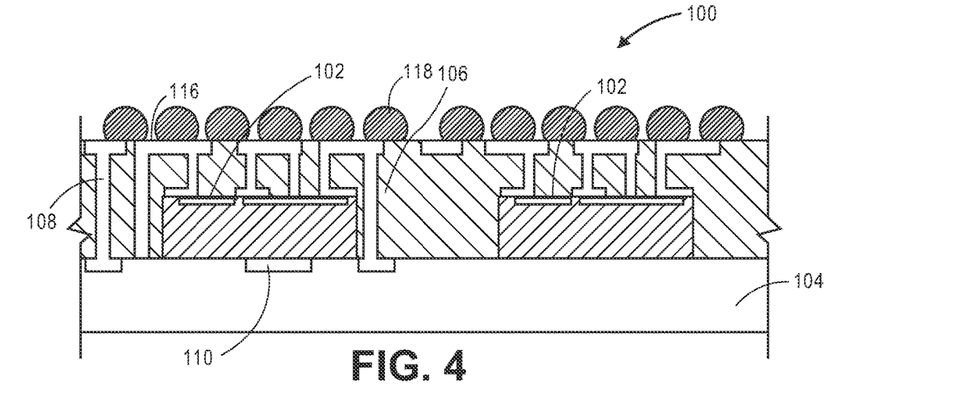
FIG. 4 is a diagrammatic cross-sectional side elevation view illustrating an integrated circuit device including a first die embedded in an overmold molded onto a semiconductor wafer over the first die, where the first die is arranged in a face-up orientation, and further including a second die embedded in the overmold molded onto the semiconductor wafer, where the second die is arranged in a face-up orientation in accordance with an example implementation of the present disclosure.
Figure 5:
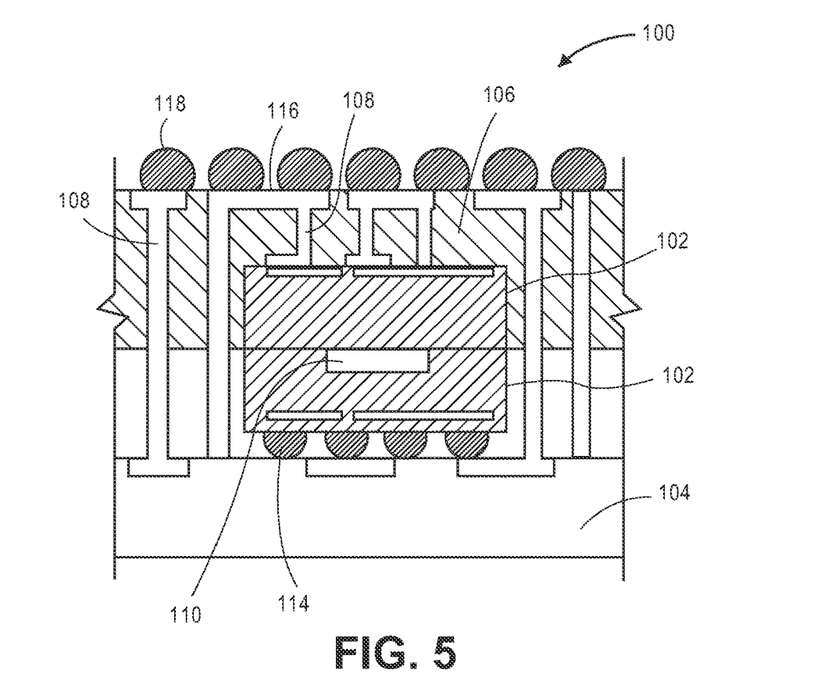
FIG. 5 is a diagrammatic cross-sectional side elevation view illustrating an integrated circuit device including a first die embedded in an overmold molded onto a semiconductor wafer over the first die, where the first die is arranged in a face-down orientation, and further including a second die embedded in the overmold and molded onto a die attach pad of the first die in a face-up orientation in accordance with an example implementation of the present disclosure.

More than one die 102 can be included with the chip package 100. For example, two dies 102 can be provided in a side-by-side configuration (e.g., as illustrated in FIGS. 1A through 4). Further, in some configurations, a die 102 arranged in a face-up orientation can be included in a side-by-side configuration in the same chip package 100 with a die arranged in a face-down orientation (e.g., as illustrated in FIGS. 2 and 3). In some instances, one or more dies 102 may be connected to circuitry included on the wafer 104, while one or more other dies 102 may use the wafer 104 as a dummy wafer (e.g., as illustrated in FIGS. 3 and 4). Further, two or more dies 102 can be stacked on top of one another, and connected to the wafer 104 (e.g., as illustrated in FIG. 5).

Figure 6:
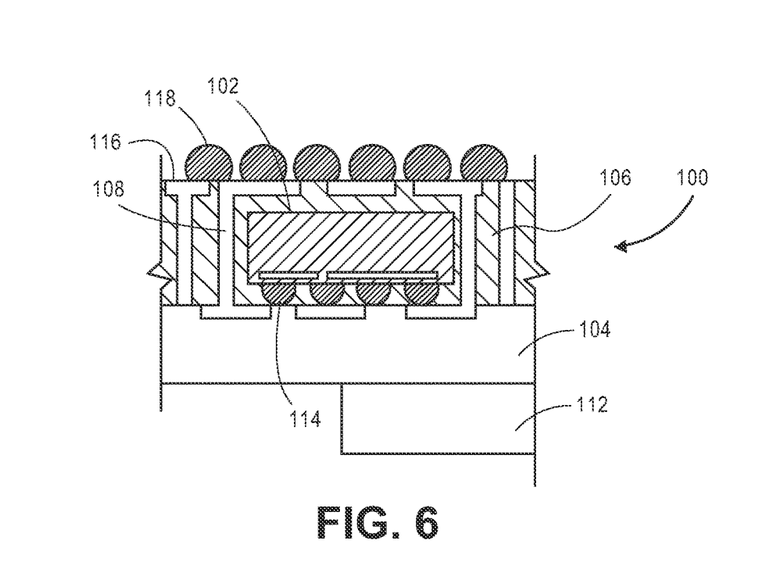
FIG. 6 is a diagrammatic cross-sectional side elevation view illustrating an integrated circuit device including a die embedded in an overmold molded onto a semiconductor wafer over the die, where the die is arranged in a face-down orientation, and where the integrated circuit device includes an external thermal heat sink in accordance with an example implementation of the present disclosure.

In one configuration, the die 102 and the wafer 104 can be heterogeneous. For instance, the die 102 can be a digital or passive component, and the wafer 104 can include an analog component, such as an analog System of a Chip (SoC), and so forth. However, this configuration is provided by way of example only and is not meant to be restrictive of the present disclosure. Thus, other configurations can use other arrangements of digital and/or analog components in heterogeneous and homogeneous configurations. For example, the die 102 can be an analog component, and the wafer 104 can include a digital component. In some instances, the pillars 108 may be used for thermal management of the chip package 100. For instance, the pillars 108 can be thermally connected to a heat sink (e.g., an external heat sink 112, as illustrated in FIG. 6), a thermal pad, and so forth for transferring heat from the dies 102 and/or the wafer 104. For example, with reference to FIG. 6, solder balls 118 are connected to pillars 108, which are connected to wafer 104, which is connected to heat sink 112. In this manner, a continuous path for heat dissipation is provided from the die 102 to the wafer 104.

Example Fabrication Process

Figure 7:
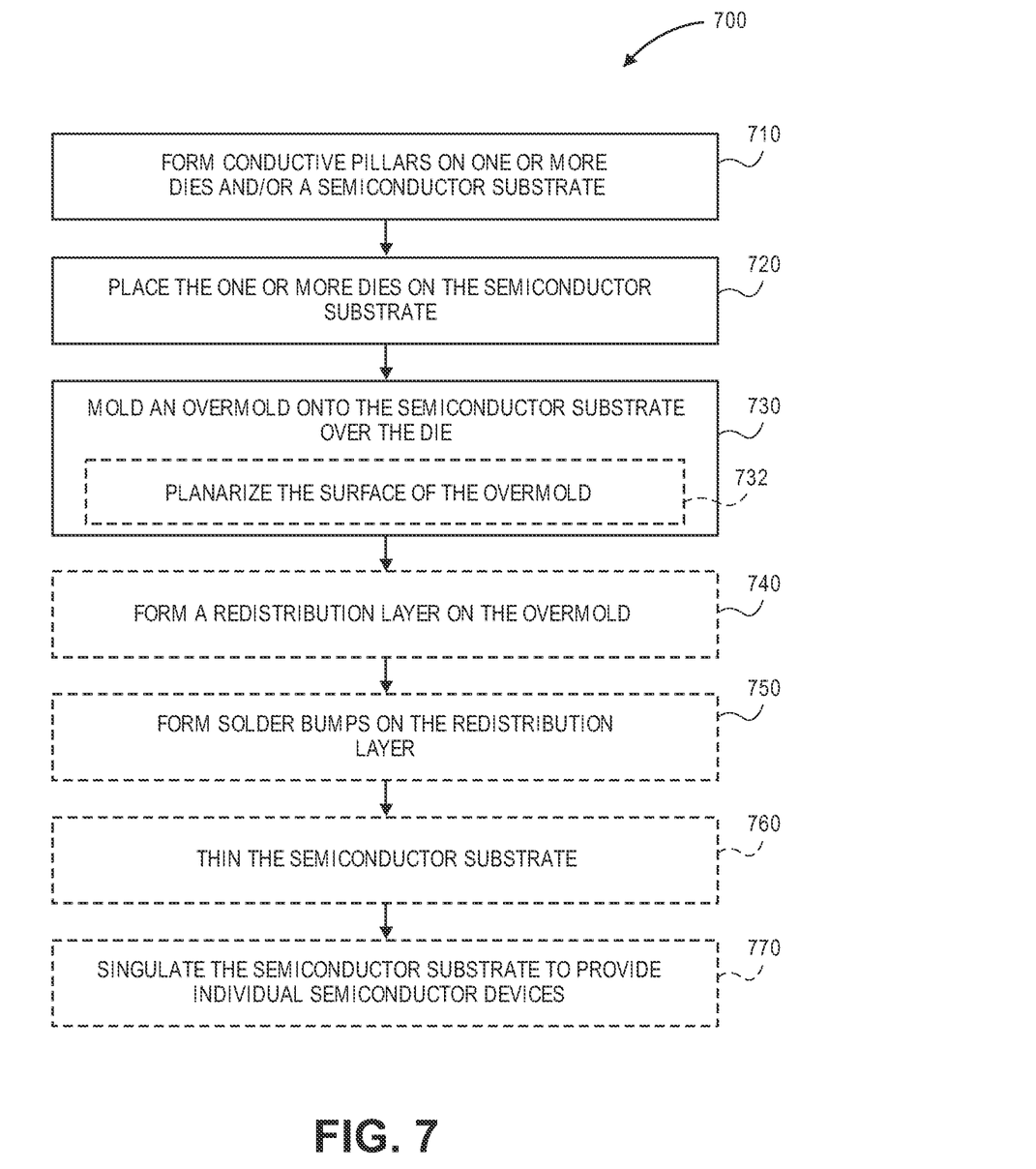
FIG. 7 is a flow diagram illustrating a method of forming a 3D semiconductor chip package including one or more dies connected with conductive pillars, where the chip package is formed by molding a die to a semiconductor substrate using an overmold.

The following discussion describes example techniques for fabricating a 3D semiconductor chip package including one or more dies connected with conductive pillars, where the chip package is formed in a Wafer Level Packaging (WLP) process by molding a die onto a semiconductor substrate using an overmold. FIG. 7 depicts a process 700, in an example implementation, for fabricating a semiconductor device, such as the example chip packages 100 illustrated in FIGS. 1A through 6 and described above. In the process 700 illustrated, conductive pillars are formed on the die and/or the semiconductor substrate (Block 710). For example, with reference to FIGS. 1A through 6, pillars 108, such as fine pitch pillars comprising copper or another conductive material, are formed on dies 102 and/or wafer 104. In some embodiments, the pillars 108 can be formed with a dry film photo process and may be as wide as about fifty micrometers (50 μm) and as thick as about one hundred fifty micrometers (150 μm), having a three-to-one (3:1) aspect ratio. In other embodiments, the height of the pillars 108 can be as much as about two hundred micrometers (200 μm) (e.g., using a thicker dry film photo process to form the pillars 108). The dry film photo process may include forming a seed layer of a conductive material, such as copper, on the die 102 and/or the wafer 104. Then, a dry film may be laminated onto the seed layer. Next, a negative photoresist process may be used to photoexpose the shapes of the pillars 108 into the dry film and create holes to the seed layer. Then, the pillars 108 may be electroplated from the bottom up by depositing the conductive material in the holes in the dry film. The dry film photo process is provided by way of example only and is not meant to be restrictive of the present disclosure. Thus, the pillars 108 may be formed using other fabrication techniques, conductive materials, and so forth. In embodiments, the pillars 108 may be formed on the dies 102 and/or the wafer 104 when the dies 102 and/or the wafer 104 are on a contiguous wafer. For example, the pillars 108 may be formed on a wafer including the die 102, which may then be thinned down and diced (singulated).

One or more dies are next placed on a semiconductor substrate, such as a wafer (Block 710). For example, with continuing reference to FIGS. 1A through 6, a pick and place tool may be used to place dies 102 on wafer 104. In some implementations, the die 102 can be attached to the wafer using epoxy glue. In some embodiments, the dies 102 can be placed on the wafer 104 in a face down orientation. In this type of configuration, the die 102 can be connected to the wafer 104 using solder balls 114, and so forth. In other embodiments, the die 102 can be placed on the wafer 104 in a face up orientation. In this type of configuration, the die 102 can be connected to the wafer 104 using a die attach pad 110, and so forth. It should be noted that in this type of configuration, solder balls, copper pillars, and so forth may be formed on the wafer 104 and used to align the die 102 on the wafer 104. In some instances, a die 102 can be thinned prior to molding the die 102 to the wafer 104 (e.g., using a back grind tool).

An overmold is then molded onto the semiconductor substrate over the dies (Block 730). For example, with continuing reference to FIGS. 1A through 6, die 102 can be embedded in mold compound 106 by molding the mold compound 106 onto wafer 104 over the die 102. The mold compound 106 may comprise a liquid or power material, such as an epoxy material, a resin based material, and/or a thermoplastic elastomer material. For example, in a specific instance, an epoxy backbone can be used with a spherical epoxy filler material. The mold compound 106 may be selected based upon characteristics including, but not limited to: Coefficient of Thermal Expansion (CTE), flex modulus, and/or particle size. For example, a mold compound 106 may be selected to provide a desired filling capability for permeating between the pillars 108. Further, the mold compound 106 may be configured to permeate between the die 102 and the wafer 104 (e.g., in the manner of an under fill having a high filler content and small particle size in comparison to the over molding material). For example, when the spacing between the die 102 and the wafer 104 is between about forty micrometers and sixty micrometers (40 µm-60 µm), capillary action may be used to draw the mold compound 106 into the space between the die 102 and the wafer 104.

In some embodiments, a transfer molding process can be used with the mold compound 106. In an embodiment, a liquid mold compound 106 may be used to form the overmold. In other embodiments, a compression molding process can be used with the mold compound 106. For example, a granular mold compound 106 is placed in a compression mold cavity, pressure is applied to the mold compound 106, and then heat and pressure are maintained until the molding material has cured. It should be noted that the thickness of the mold compound 106 may be selected to prevent or minimize the effects of pressure upon the pillars 108. For example, when compression molding is used, the thickness of the mold compound 106 can be selected to be greater than the height of the pillars 108. However, in other embodiments, the thickness of the mold compound 106 may be equal to or less than the height of the pillars 108. In some embodiments, planarization may be used to flatten the surface of the overmold (Block 732). For example, when mold compound 106 is molded using a transfer molding process, face grinding can be used to flatten the mold compound 106 and expose pillars 108.

One or more redistribution layers (RDL) may next be formed on the overmold (Block 740). For example, with continuing reference to FIGS. 1A through 6, redistribution layer 116 can be applied on mold compound 106. It should be noted that other material may be deposited on the mold compound 106 in addition to the redistribution layer 116. For example, lead oxide and/or low temperature polyimide may be used to provide Under Bump Metallization (UBM). Additionally, it should be noted that multiple RDL's may be formed on the mold compound 106. Further, in some configurations, the chip package 100 does not necessarily include an RDL (e.g., when a die is placed on a semiconductor substrate in a face-down orientation). Then, one or more solder bumps may be formed on the redistribution layer (Block 750). For example, with continuing reference to FIGS. 1A through 6, external solder bumps 118 are applied to redistribution layer 116. In some instances, the semiconductor substrate may be thinned to reduce the overall thickness of the chip package (Block 760). For example, the wafer 104 can be thinned using back grinding and so forth. Next, the semiconductor substrate may be singulated to provide individual integrated circuit devices (Block 770). For example, with continuing reference to FIGS. 1A through 6, wafer 104 can be singulated to provide individual chip packages 100. In some implementations, a heat sink can be connected to a silicon surface of the chip package 100. For example, with reference to FIG. 6, heat sink 112 can be connected to a bottom side of the wafer 104 (i.e., a side opposite the die 102).

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A semiconductor device comprising:
a semiconductor substrate, the semiconductor substrate having electrical circuitry, the semiconductor substrate further having a plurality of solder balls attached thereto;
a first die having a first face, a second face, and a die attach pad disposed in the first face, the solder balls further attached to the second face;
a second die having a second face, the second die attached to the die attach pad disposed in the first face of the first die, the first die and the second die stacked so that the first face and the second face are in direct contact;
an overmold molded onto the semiconductor substrate over the first die and the second die;
a conductive pillar connected to at least one of the electrical circuitry of the semiconductor substrate, the first die, or the second die, the conductive pillar extending through the overmold;
a redistribution layer formed on the overmold; and
a plurality of solder bumps formed on the redistribution layer, at least one of the plurality of solder bumps connected to the conductive pillar via the redistribution layer.

2. The semiconductor device as recited in claim 1, wherein the semiconductor substrate and the first die comprise at least substantially the same coefficient of thermal expansion.

3. The semiconductor device as recited in claim 1, wherein the semiconductor substrate comprises a carrier, and a plurality of connections to a first die fan-out.

4. The semiconductor device as recited in claim 1, wherein the semiconductor substrate comprises a third die.

5. The semiconductor device as recited in claim 4, wherein the first die comprises one of an analog component or a digital component and the semiconductor substrate comprises the other of an analog component or a digital component.

6. The semiconductor device as recited in claim 1, wherein the conductive pillar furnishes electrical connection to the at least one of the semiconductor substrate or the second die.

7. The semiconductor device as recited in claim 1, wherein the conductive pillar is configured to transfer heat from at least one of the semiconductor substrate or the second die.

8. The semiconductor device as recited in claim 1, further comprising a heat sink coupled with a side of the semiconductor substrate opposite the second die.

9. A semiconductor device comprising:
a first die, the first die having electrical circuitry;
a second die attached to the first die, the second die having a first face and a die attach pad disposed in the first face;
a third die having a second face, the third die attached to the die attach pad disposed in the first face of the second die, the second die and the third die stacked so that the first face and the second face are in direct contact;
an overmold molded onto the first die over the second die;
a conductive pillar connected to at least one of the electrical circuitry of the first die, the second die, or the third die, the conductive pillar extending through the overmold;
a redistribution layer formed on the overmold; and
a plurality of solder bumps formed on the redistribution layer, at least one of the plurality of solder bumps connected to the conductive pillar via the redistribution layer.

10. The semiconductor device as recited in claim 9, wherein the first die and the second die comprise at least substantially the same coefficient of thermal expansion.

11. The semiconductor device as recited in claim 1, wherein the second face of the first die is positioned in substantially facing relation to the semiconductor substrate.

* * * * *